United States Patent
Kirihata et al.

(10) Patent No.: US 9,070,822 B2
(45) Date of Patent: Jun. 30, 2015

(54) METHOD FOR PRODUCING PHOTOELECTRIC CONVERSION ELEMENT

(71) Applicant: SANYO Electric Co., Ltd., Osaka (JP)

(72) Inventors: Yutaka Kirihata, Kaizuka (JP); Taiki Hashiguchi, Kaizuka (JP)

(73) Assignee: PANASONIC INTELLECTUAL PROPERTY MANAGEMENT CO., LTD. (JP)

( * ) Notice: Subject to any disclaimer, the term of this patent is extended or adjusted under 35 U.S.C. 154(b) by 0 days.

(21) Appl. No.: 14/036,847

(22) Filed: Sep. 25, 2013

(65) Prior Publication Data

US 2014/0024167 A1 Jan. 23, 2014

Related U.S. Application Data

(63) Continuation of application No. PCT/JP2012/056867, filed on Mar. 16, 2012.

(30) Foreign Application Priority Data

Mar. 25, 2011 (JP) ................................. 2011-068311

(51) Int. Cl.
- *H01L 21/00* (2006.01)
- *H01L 31/20* (2006.01)
- *H01L 31/0224* (2006.01)
- *H01L 31/0747* (2012.01)
- *H01L 31/0352* (2006.01)
- *H01L 31/068* (2012.01)

(52) U.S. Cl.
CPC ........ *H01L 31/20* (2013.01); *H01L 31/022441* (2013.01); *H01L 31/0747* (2013.01); *H01L 31/03529* (2013.01); *H01L 31/0682* (2013.01); *H01L 31/202* (2013.01); *Y02E 10/547* (2013.01)

(58) Field of Classification Search
None
See application file for complete search history.

(56) References Cited

U.S. PATENT DOCUMENTS

| | | | | |
|---|---|---|---|---|
| 4,626,878 | A | * 12/1986 | Kuwano et al. | ................. 257/53 |
| 2001/0008295 | A1 | * 7/2001 | Sakata et al. | ................. 257/436 |
| 2005/0025025 | A1 | * 2/2005 | Nomura et al. | .......... 369/112.01 |

(Continued)

FOREIGN PATENT DOCUMENTS

| | | |
|---|---|---|
| EP | 2293351 A2 | 3/2011 |
| JP | 2005159171 A | 6/2005 |
| JP | 2007197745 A | 8/2007 |

(Continued)

OTHER PUBLICATIONS

Extended European Search Report regarding Application No. 12765778.1-1508/2690668 PCT/JP2012056867; Date of Mailing: Aug. 6, 2014.

*Primary Examiner* — Calvin Choi
(74) *Attorney, Agent, or Firm* — Cantor Colburn LLP

(57) ABSTRACT

The method disclosed herein includes a first step of forming an i-type amorphous silicon layer 16 and an n-type amorphous silicon layer 14 on a light-receiving surface of an n-type monocrystalline silicon substrate 18; a second step of forming an i-type amorphous silicon layer 22a and an n-type amorphous silicon layer 23a on a backside surface of the n-type monocrystalline silicon substrate 18; and a third step of forming, after completion of the first step and the second step, an antireflection layer 12 on the n-type amorphous silicon layer 14, and subsequently forming an insulating layer 24a on the n-type amorphous silicon layer 23a.

3 Claims, 7 Drawing Sheets

(56) References Cited

U.S. PATENT DOCUMENTS

2010/0330730 A1 12/2010 Hong et al.
2012/0012179 A1 1/2012 Asaumi et al.
2012/0247539 A1* 10/2012 Roca i Cabarrocas ........ 136/249

FOREIGN PATENT DOCUMENTS

| JP | 2009200267 A | 9/2009 |
| JP | 2011035092 A | 2/2011 |
| WO | 2010113750 A1 | 10/2010 |

* cited by examiner

METHOD FOR PRODUCING PHOTOELECTRIC CONVERSION ELEMENT

CROSS-REFERENCE TO RELATED APPLICATION

The present application is a continuation under 35 U.S.C. §120 of PCT/JP2012/056867, filed Mar. 16, 2012, which is incorporated herein by reference and which claimed priority to Japanese Patent Application No. 2011-068311 filed Mar. 25, 2011. The present application likewise claims priority under 35 U.S.C. §119 to Japanese Patent Application No. 2011-068311 filed Mar. 25, 2011, the entire content of which is also incorporated herein by reference.

TECHNICAL FIELD

The present invention relates to a method for producing a photoelectric conversion element.

BACKGROUND ART

Various types of photoelectric conversion elements using monocrystalline silicon, polycrystalline silicon, or amorphous silicon have been developed. As an example, Patent Document 1 discloses a photoelectric conversion element comprising a semiconductor substrate composed of monocrystalline silicon having a light-receiving surface and a backside surface provided opposite to the light-receiving surface; a first semiconductor layer and a second semiconductor layer both composed of amorphous silicon which are formed along a predetermined direction on the backside surface, in which layers having different conductivity types are alternately arranged on the backside surface; an insulating layer formed to span from above the second semiconductor layer to above the first semiconductor layer; a transparent electrode layer covering the first semiconductor layer and the second semiconductor layer; and a collector electrode layer formed on the transparent electrode layer.

PRIOR ART DOCUMENTS

Patent Documents

Patent Document 1: JP 2009-200267 A

SUMMARY OF THE INVENTION

Problems to be Solved by the Invention

In a photoelectric conversion element for generating carriers in a semiconductor substrate, very small projections and depressions (texture) are formed on the light-receiving surface of the semiconductor substrate to cause a scattering of incident light to lengthen the optical path length, so that power generation efficiency is increased. The texture formed on the light-receiving surface of the semiconductor substrate is formed before the first semiconductor layer and the second semiconductor layer (amorphous silicon layers) are formed. As such, the structure having projections and depressions may become deformed through the process of forming an amorphous silicon layer or an insulating layer, which results in a problem in that the effect of scattering incident light cannot be sufficiently achieved.

Means for Solving the Problems

According to one aspect of the present invention, there is provided a method for producing a photoelectric conversion element, the method comprising a first step of forming a first amorphous semiconductor layer on a light-receiving surface of a crystalline semiconductor substrate; a second step of forming a second amorphous semiconductor layer on a backside surface of the crystalline semiconductor substrate; and a third step of forming, after completion of the first step and the second step, a protective layer on the first amorphous semiconductor layer, and subsequently forming a protective layer on the second amorphous semiconductor layer.

Advantages of the Invention

By employing the present invention, the power generation characteristics of a photoelectric conversion element can be improved.

EMBODIMENTS FOR CARRYING OUT THE INVENTION

Figure 1:
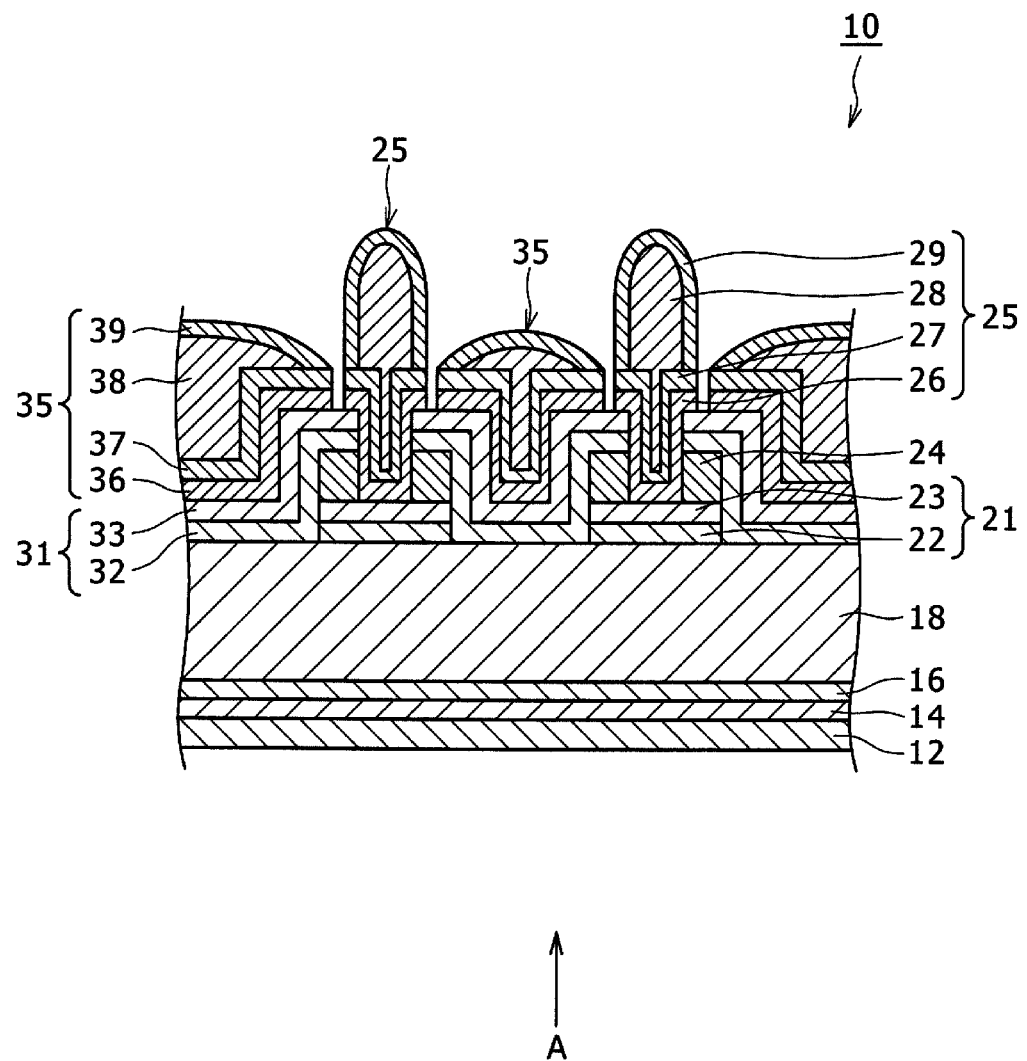
FIG. 1 is a cross-sectional view of a photoelectric conversion element according to an embodiment of the present invention.

An embodiment of the present invention will be described in detail below with reference to the drawings. In the following description, similar elements are denoted by the same reference numerals throughout all of the drawings, and the same description will not be repeated. Also, in the description herein, reference numerals used earlier will be used as necessary.

FIG. 1 is a cross-sectional view of a photoelectric conversion element 10. The photoelectric conversion element 10 includes an antireflection layer 12, an n-type amorphous silicon layer 14, an i-type amorphous silicon layer 16, an n-type monocrystalline silicon substrate 18, an i-n multilayer portion 21, an i-p multilayer portion 31, an insulating layer 24, an n-side electrode portion 25, and a p-side electrode portion 35. In FIG. 1, an arrow A represents the direction in which light such as sunlight is incident on the photoelectric conversion element 10. It should be noted that the term "light-receiving surface" refers to a surface on which light such as sunlight is mainly incident. Further, the term "backside surface" refers to a surface opposite to the light-receiving surface.

The n-type monocrystalline silicon substrate 18 is a power generation layer that generates carriers in response to light incident through the light-receiving surface. It should be noted that although the n-type monocrystalline silicon substrate 18 is used in the present embodiment, the present invention is not limited to this embodiment. A crystalline semiconductor substrate having an n-type or p-type conductivity may be used. Rather than a monocrystalline silicon substrate, for example, a polycrystalline silicon substrate, a gallium arsenide substrate (GaAs), an indiumphosphide substrate (InP), or the like may be used.

The i-type amorphous silicon layer 16 and the n-type amorphous silicon layer 14 are passivation layers formed on the light-receiving surface of the n-type monocrystalline silicon substrate 18. The i-type amorphous silicon layer 16 and the n-type amorphous silicon layer 14 constitute an amorphous semiconductor layer formed on the light-receiving surface. The i-type amorphous silicon layer 16 is composed of an intrinsic amorphous semiconductor film. The n-type amorphous silicon layer 14 is composed of an amorphous semiconductor film containing a dopant having an n-type conductivity. For example, it is preferable that the concentration of the n-type dopant in the n-type amorphous silicon layer 14 is $1 \times 10^{21}/cm^3$ or higher.

It should be noted that in the present embodiment, the amorphous silicon layers include a microcrystalline semiconductor film. The microcrystalline semiconductor film is a film in which crystal grains are precipitated in an amorphous semiconductor. The average grain size of the crystal grains is estimated to be, but not limited to, not less than about 1 nm and not greater than about 80 nm.

The antireflection layer 12 is formed on the n-type amorphous silicon layer 14, and reduces reflection of light incident through the light-receiving surface of the photoelectric conversion element 10. Further, the antireflection layer 12 also serves as a protective layer for protecting a surface of the n-type amorphous silicon layer 14. It is preferable that the antireflection layer 12 is formed of a transparent material, and the material and the film thickness are adjusted such that the antireflection layer 12 has an index of refraction at which reflection of light incident through the light-receiving surface of the photoelectric conversion element 10 is reduced in relation to the index of refraction of a layer covered by the antireflection layer 12. The antireflection layer 12 comprises, for example, aluminum oxide, aluminum nitride, silicon nitride, silicon oxide, or the like.

The i-n multilayer portion 21 is formed on the backside surface of the n-type monocrystalline silicon substrate 18, and includes an i-type amorphous silicon layer 22 and an n-type amorphous silicon layer 23. It is preferable that the i-n multilayer portion 21 is disposed such that a greater amount of current can be collected from inside the plane of the photoelectric conversion element 10 in the n-side electrode portion 25 which will be described later. It is preferable that the i-n multilayer portion 21 has, for example, a comb shape in which a plurality of finger portions extend in parallel with each other.

The i-type amorphous silicon layer 22 is a passivation layer formed on the backside surface of the n-type monocrystalline silicon substrate 18. The n-type amorphous silicon layer 23 is formed on the i-type amorphous silicon layer 22. The i-type amorphous silicon layer 22 and the n-type amorphous silicon layer 23 constitute a portion of an amorphous semiconductor layer formed on the backside surface. The i-type amorphous silicon layer 22 is composed of an intrinsic amorphous semiconductor film. The n-type amorphous silicon layer 23 is composed of an amorphous semiconductor film containing a dopant having an n-type conductivity. For example, it is preferable that the concentration of the n-type dopant in the n-type amorphous silicon layer 23 is $1 \times 10^{21}/cm^3$ or higher.

The insulating layer 24 is formed in order to electrically insulate the i-n multilayer portion 21 and the i-p multilayer portion 31 from each other. Further, the insulating layer 24 also serves as a protective layer formed on the n-type amorphous silicon layer 23. Although the insulating layer 24 may be any material having an electrically insulating property, it is preferable that the insulating layer 24 comprises, for example, aluminum nitride, silicon nitride, silicon oxide, or the like.

The n-side electrode portion 25 is an electrode component provided to collect and draw out electricity generated in the photoelectric conversion element 10. The n-side electrode portion 25 includes a transparent conductive layer 26, a metal layer 27, a first electrode portion 28, and a second electrode portion 29.

The transparent conductive layer 26 is formed on the n-type amorphous silicon layer 23. The transparent conductive layer 26 comprises at least one of metal oxides such as indium oxide ($In_2O_3$), zinc oxide (ZnO), tin oxide ($SnO_2$), titanium oxide ($TiO_2$), and indium tin oxide (ITO). In this description, it is assumed that the transparent conductive layer 26 is formed using indium tin oxide (ITO).

The metal layer 27 is formed on the transparent conductive layer 26. The metal layer 27 is a seed layer comprising, for example, a metal such as copper (Cu) or an alloy. The term "seed layer" as used herein refers to a layer from which plating growth starts.

The first electrode portion 28 is an electrode formed on the metal layer 27 by plating. The first electrode portion 28 comprises, for example, copper (Cu).

The second electrode portion 29 is an electrode formed on the first electrode portion 28 by plating. The second electrode portion 29 comprises, for example, tin (Sn).

The i-p multilayer portion 31 is formed such that the i-p multilayer portion 31 and the i-n multilayer portion 21 are alternately arranged on the backside surface of the n-type monocrystalline silicon substrate 18. The i-p multilayer portion 31 includes an i-type amorphous silicon layer 32 and a p-type amorphous silicon layer 33. It is preferable that the i-p multilayer portion 31 is disposed such that a greater amount of current can be collected from inside the plane of the photoelectric conversion element 10 in the p-side electrode portion 35 which will be described later. It is preferable that the i-p multilayer portion 31 has, for example, a comb shape in which a plurality of finger portions extend parallel with each other.

The i-type amorphous silicon layer 32 is a passivation layer formed on the backside surface of the n-type monocrystalline silicon substrate 18. The p-type amorphous silicon layer 33 is formed on the i-type amorphous silicon layer 32. The i-type amorphous silicon layer 32 and the p-type amorphous silicon layer 33 constitute a portion of an amorphous semiconductor layer formed on the backside surface. The i-type amorphous silicon layer 32 is composed of an intrinsic amorphous semiconductor film. The p-type amorphous silicon layer 33 is composed of an amorphous semiconductor film containing a dopant having a p-type conductivity. For example, it is preferable that the concentration of the p-type dopant in the p-type amorphous silicon layer 33 is $1 \times 10^{21}/cm^3$ or higher.

The p-side electrode portion 35 is an electrode component provided to collect and draw out electricity generated in the photoelectric conversion element 10. The p-side electrode portion 35 includes a transparent conductive layer 36, a metal layer 37, a first electrode portion 38, and a second electrode portion 39.

The transparent conductive layer 36 is formed on the p-type amorphous silicon layer 33. The metal layer 37, the first electrode portion 38, and the second electrode portion 39 are formed on the transparent conductive layer 36. As the materials and other features for the transparent conductive layer 36, the metal layer 37, the first electrode portion 38, and the second electrode portion 39 are the same as for the transparent conductive layer 26, the metal layer 27, the first electrode portion 28, and the second electrode portion 29, detailed description is not repeated here.

Figure 2:
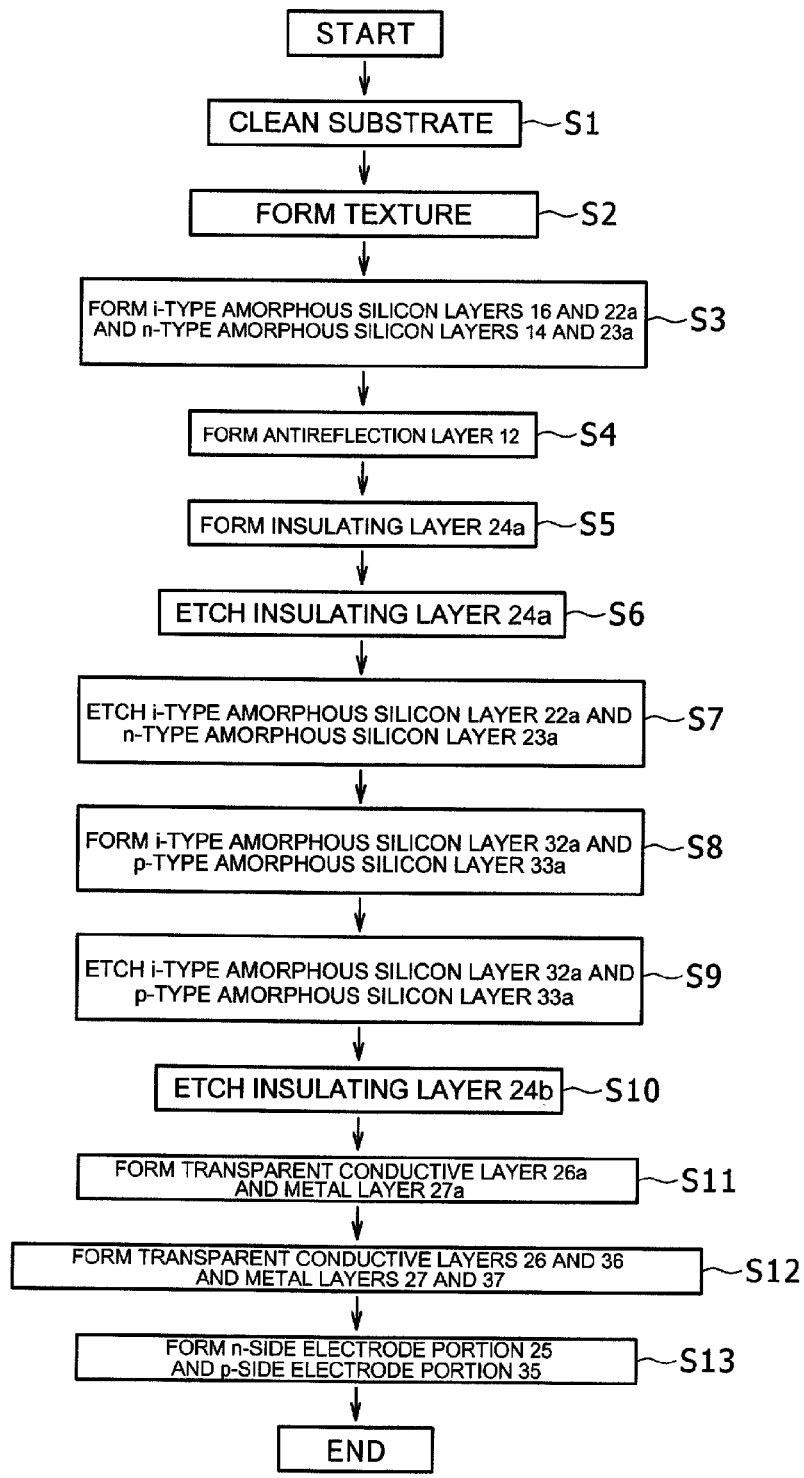
FIG. 2 is a flowchart showing steps of a method for producing a photoelectric conversion element according to the embodiment of the present invention.

Next, an example of a method for producing the photoelectric conversion element 10 will be described below. FIG. 2 is a flowchart showing steps of the method for producing the photoelectric conversion element 10. It should be noted that the method for producing the photoelectric conversion element 10 is not limited to the method illustrated in the steps in FIG. 2. In each of the steps, for example, a sputtering process, plasma CVD process, screen printing process, plating process, or the like may be used as desired.

First, an n-type monocrystalline silicon substrate 18 is prepared, and the light-receiving surface and the backside surface of the n-type monocrystalline silicon substrate 18 are cleaned (S1). In this step, the n-type monocrystalline silicon substrate 18 may be cleaned using, for example, an HF aqueous solution or the like.

Next, a texture structure is formed on the light-receiving surface of the n-type monocrystalline silicon substrate 18 (S2). In this step, the texture structure is formed using, for example, an anisotropic etching solution such as a potassium hydroxide aqueous solution (KOH aqueous solution). As a result, a shape having pyramidal projections and depressions can be formed on the light-receiving surface of the n-type monocrystalline silicon substrate 18.

Figure 3:
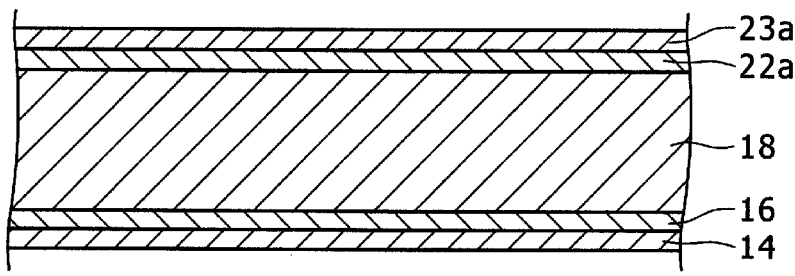
FIG. 3 is a cross-sectional view for illustrating the steps of the method for producing a photoelectric conversion element according to the embodiment of the present invention.

Then, as shown in FIG. 3, the i-type amorphous silicon layer 16 and the n-type amorphous silicon layer 14 are formed on the light-receiving surface of the n-type monocrystalline silicon substrate 18, and the i-type amorphous silicon layer 22a and the n-type amorphous silicon layer 23a are formed on the backside surface of the n-type monocrystalline silicon substrate 18 (S3). In this step, the i-type amorphous silicon layer 16, the n-type amorphous silicon layer 14, the i-type amorphous silicon layer 22a, and the n-type amorphous silicon layer 23a respectively can be formed by, for example, a plasma CVD process or the like.

Figure 4:
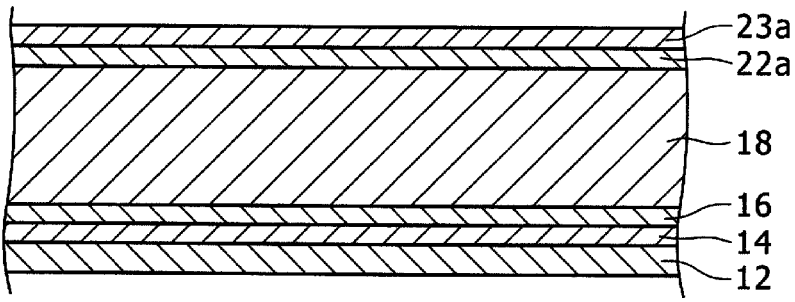
FIG. 4 is a cross-sectional view for illustrating the steps of the method for producing a photoelectric conversion element according to the embodiment of the present invention.

Subsequently, as shown in FIG. 4, an antireflection layer 12 is formed on the n-type amorphous silicon layer 14 (S4). The antireflection layer 12 can be formed by, for example, a thin film formation process such as a sputtering process or plasma CVD process.

Figure 5:
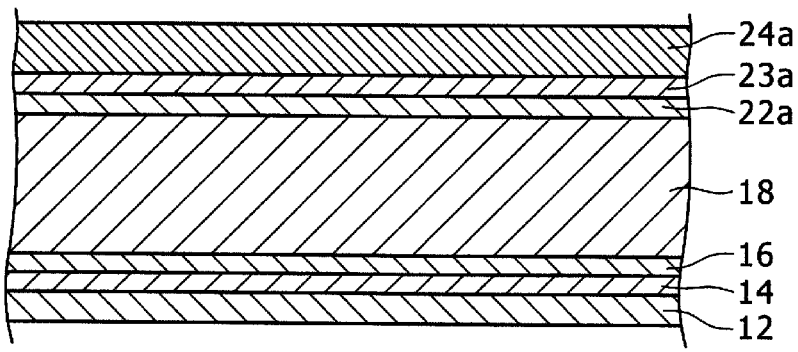
FIG. 5 is a cross-sectional view for illustrating the steps of the method for producing a photoelectric conversion element according to the embodiment of the present invention.

After that, as shown in FIG. 5, an insulating layer 24a is formed on the n-type amorphous silicon layer 23a (S5). The insulating layer 24a can be formed by, for example, a thin film formation process such as a sputtering process or plasma CVD process.

Figure 6:
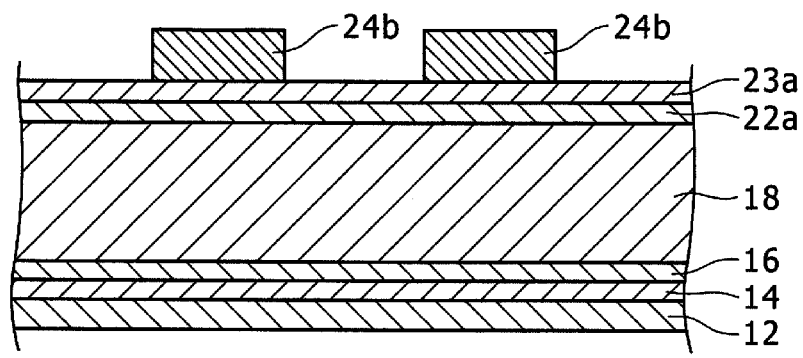
FIG. 6 is a cross-sectional view for illustrating the steps of the method for producing a photoelectric conversion element according to the embodiment of the present invention.

Next, as shown in FIG. 6, the insulating layer 24a is etched to partially remove the insulating layer 24a (S6). Specifically, a portion of the insulating layer 24a which is located above a region in which an i-p multilayer portion 31 is formed on the n-type monocrystalline silicon substrate 18 in a later step is removed to form an insulating layer 24b. In this step, the insulating layer 24a is etched using, for example, an acidic etchant such as an HF aqueous solution or the like.

Figure 7:
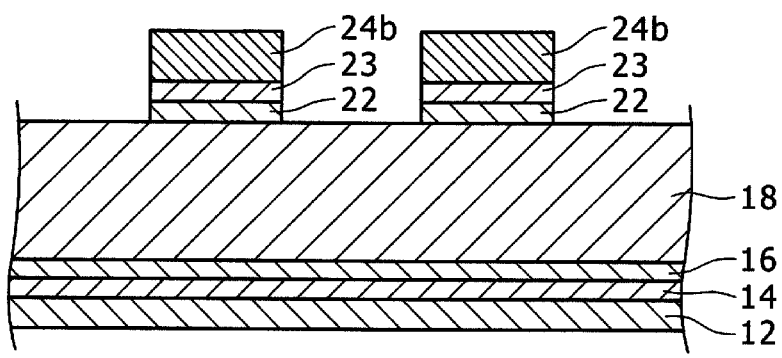
FIG. 7 is a cross-sectional view for illustrating the steps of the method for producing a photoelectric conversion element according to the embodiment of the present invention.

Then, as shown in FIG. 7, the i-type amorphous silicon layer 22a and the n-type amorphous silicon layer 23a are etched using the insulating layer 24b patterned in step S6 as a mask (S7). Specifically, a portion of the i-type amorphous silicon layer 22a and the n-type amorphous silicon layer 23a other than that covered by the insulating layer 24b is removed. As a result, a portion of the backside surface of the n-type monocrystalline silicon substrate 18 in which the insulating layer 24b is not located is exposed to form an i-type amorphous silicon layer 22 and an n-type amorphous silicon layer 23. In this step, the i-type amorphous silicon layer 22a and the n-type amorphous silicon layer 23a are etched using, for example, an alkaline etchant such as an aqueous solution containing sodium hydroxide (NaOH).

Figure 8:
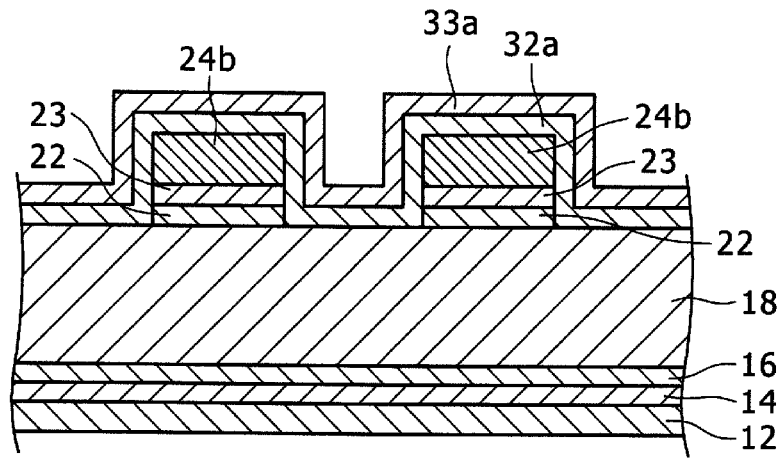
FIG. 8 is a cross-sectional view for illustrating the steps of the method for producing a photoelectric conversion element according to the embodiment of the present invention.

Subsequently, as shown in FIG. 8, an i-type amorphous silicon layer 32a and a p-type amorphous silicon layer 33a are formed to cover the insulating layer 24b, the i-type amorphous silicon layer 22, the n-type amorphous silicon layer 23, and the exposed backside surface of the n-type monocrystalline silicon substrate 18 (S8). The i-type amorphous silicon layer 32a and the p-type amorphous silicon layer 33a can be formed by, for example, a plasma CVD process or the like.

Figure 9:
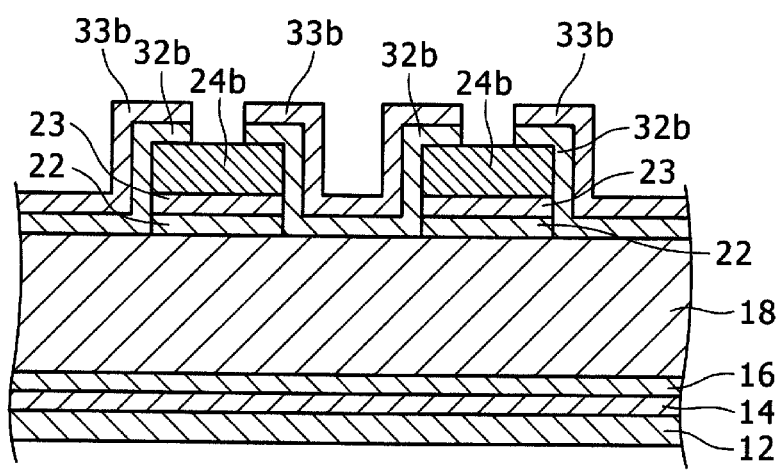
FIG. 9 is a cross-sectional view for illustrating the steps of the method for producing a photoelectric conversion element according to the embodiment of the present invention.

After that, as shown in FIG. 9, a portion of the i-type amorphous silicon layer 32a and the p-type amorphous silicon layer 33a located above the insulating layer 24b is partially etched (S9). As a result, an i-type amorphous silicon layer 32b and a p-type amorphous silicon layer 33b are formed. In this step, the i-type amorphous silicon layer 32a and the p-type amorphous silicon layer 33a are etched using, for example, an alkaline etchant such as an aqueous solution containing sodium hydroxide (NaOH).

Figure 10:
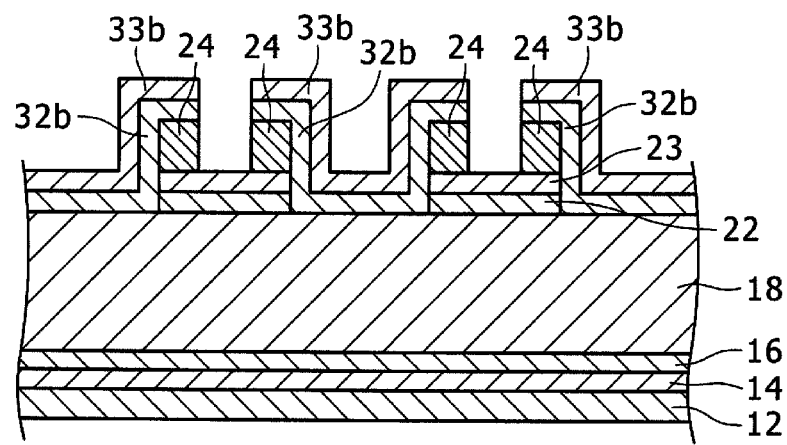
FIG. 10 is a cross-sectional view for illustrating the steps of the method for producing a photoelectric conversion element according to the embodiment of the present invention.

Next, as shown in FIG. 10, the insulating layer 24b is etched to further partially remove the insulating layer 24b (S10). Specifically, the exposed portion of the insulating layer 24b is removed by etching using the i-type amorphous silicon layer 32b and the p-type amorphous silicon layer 33b as a mask to form an insulating layer 24. In this step, the insulating layer 24b is etched using, for example, an acidic etchant such as an HF aqueous solution.

Figure 11:
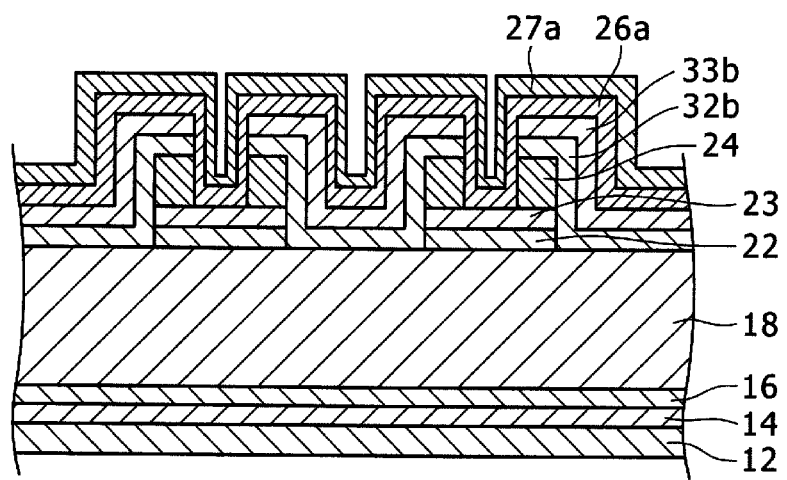
FIG. 11 is a cross-sectional view for illustrating the steps of the method for producing a photoelectric conversion element according to the embodiment of the present invention.

Then, as shown in FIG. 11, a transparent conductive layer 26a and a metal layer 27a are formed (S11). Specifically, the transparent conductive layer 26a and the metal layer 27a are formed by a thin film formation process such as a plasma CVD process or sputtering process.

Figure 12:
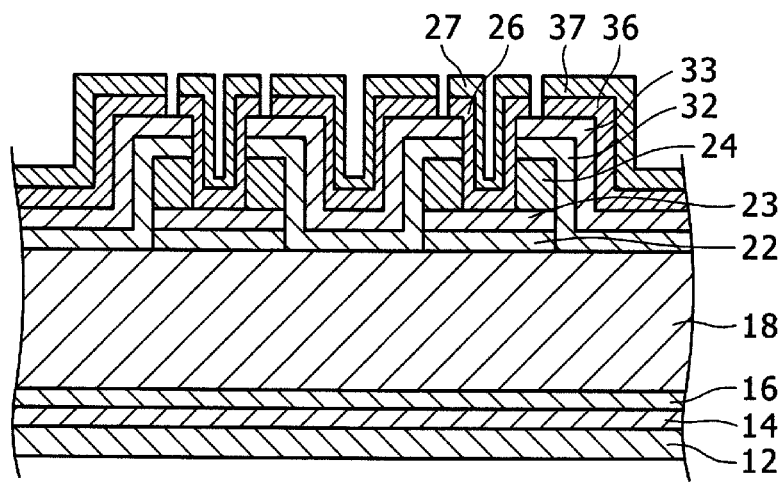
FIG. 12 is a cross-sectional view for illustrating the steps of the method for producing a photoelectric conversion element according to the embodiment of the present invention.

Subsequently, as shown in FIG. 12, a portion of the transparent conductive layer 26a and the metal layer 27a located above the insulating layer 24 is separated to form transparent conductive layers 26 and 36 and metal layers 27 and 37 (S12). In this step, the transparent conductive layer 26a and the metal layer 27a are separated by, for example, etching using a resist mask.

Figure 13:
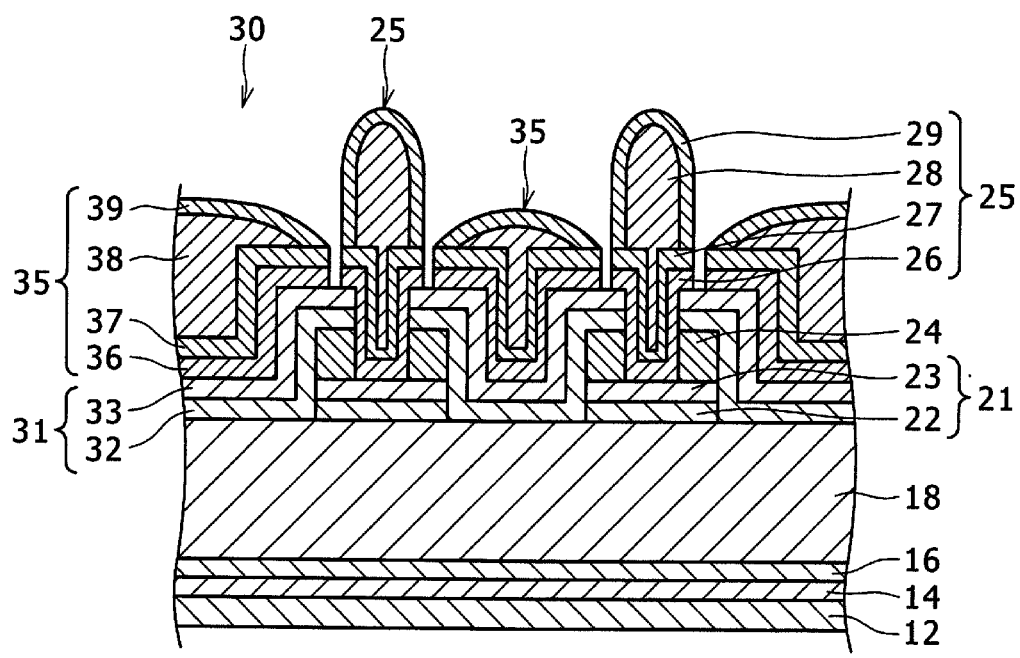
FIG. 13 is a cross-sectional view for illustrating the steps of the method for producing a photoelectric conversion element according to the embodiment of the present invention.

After that, as shown in FIG. 13, a first electrode portion 28 and a second electrode portion 29 are sequentially formed on the metal layer 27, and a first electrode portion 38 and a second electrode portion 39 are sequentially formed on the metal layer 37 by electroplating (S13). As a result, an n-side electrode portion 25 and a p-side electrode portion 35 are formed.

Typically, in order to prevent recombination of carriers generated in the n-type monocrystalline silicon substrate 18 of the photoelectric conversion element 10, it is preferable that an interface between the n-type monocrystalline silicon substrate 18 and the i-type amorphous silicon layer 16, and an interface between the n-type monocrystalline silicon substrate 18 and the i-type amorphous silicon layers 22 and 32, be kept clean. In this regard, due to, for example, the difference in degree of vacuum during deposition or a stray stream of a material gas, the degree of contamination on a surface opposite to a surface on which deposition is performed during deposition of the antireflection layer 12 and the insulating layer 24 is greater than that during deposition of the i-type amorphous silicon layers 22 and 32. In consideration of the above, according to the present embodiment, by depositing the i-type amorphous silicon layer 16 and the n-type amorphous silicon layer 14 on the light-receiving surface of the n-type monocrystalline silicon substrate 18, depositing the i-type amorphous silicon layer 22 and the n-type amorphous silicon layer 23 on the backside surface of the n-type monocrystalline silicon substrate 18, and, after that, depositing the antireflection layer 12 and the insulating layer 24, the antireflection layer 12 and the insulating layer 24 are deposited after both surfaces of the n-type monocrystalline silicon substrate 18 are covered by at least the i-type amorphous silicon layers 16 and 22. As a result, contamination of the interfaces between the n-type monocrystalline silicon substrate 18 and the i-type amorphous silicon layers 16, 22, and 32 during deposition of the antireflection layer 12 and the insulating layer 24 is prevented. As such, the i-type amorphous silicon layers 16, 22, and 32 can be made to suitably serve as a passivation layer, and the power generation characteristics of the photoelectric conversion element 10 can be improved.

Further, in terms of the order in which the antireflection layer 12 and the insulating layer 24 are deposited, the antireflection layer 12 located on the light-receiving surface side is deposited before the insulating layer 24a located on the backside surface side is deposited. In other words, by depositing the antireflection layer 12, the n-type amorphous silicon layer 14 is covered, and a stray stream of a material gas is prevented from reaching the n-type amorphous silicon layer 14 during subsequent deposition of the insulating layer 24a. As a result, presence of the above-described contaminant on the texture structure of the n-type amorphous silicon layer 14 is prevented. As such, as the n-type amorphous silicon layer 14 suitably provides the light confinement effect of the texture structure, the power generation characteristics of the photoelectric conversion element 10 can be improved.

Still further, the antireflection layer 12 typically has a higher mechanical strength than that of the n-type amorphous silicon layer 14. As a result, as the n-type amorphous silicon layer 14 is covered by the antireflection layer 12, scratches made on the surface of the n-type amorphous silicon layer 14 during the manufacturing process of the photoelectric conversion element 10 can be reduced. As such, as the n-type amorphous silicon layer 14 suitably provides the light confinement effect of the texture structure, the power generation characteristics of the photoelectric conversion element 10 can be improved.

REFERENCE NUMERALS

10 PHOTOELECTRIC CONVERSION ELEMENT
12, 24, 24a, 24b INSULATING LAYER
14, 23, 23a N-TYPE AMORPHOUS SILICON LAYER
16, 22, 22a, 32, 32a, 32b I-TYPE AMORPHOUS SILICON LAYER
18 N-TYPE MONOCRYSTALLINE SILICON SUBSTRATE
21 I-N MULTILAYER PORTION
25 N-SIDE ELECTRODE PORTION
26, 26a, 36 TRANSPARENT CONDUCTIVE LAYER
27, 27a, 37 METAL LAYER
28, 38 FIRST ELECTRODE PORTION
29, 39 SECOND ELECTRODE PORTION
31 I-P MULTILAYER PORTION
33, 33a, 33b P-TYPE AMORPHOUS SILICON LAYER
35 P-SIDE ELECTRODE PORTION

The invention claimed is:

1. A method for producing a photoelectric conversion element, the method comprising:
    forming a first amorphous semiconductor layer on a light-receiving surface of a crystalline semiconductor substrate;
    forming a second amorphous semiconductor layer on a backside surface of the crystalline semiconductor substrate; and
    forming, after completion of the forming a first amorphous semiconductor layer and the forming a second amorphous semiconductor layer, a protective layer on the first amorphous semiconductor layer, and subsequently forming a protective layer on the second amorphous semiconductor layer;
    wherein the crystalline semiconductor substrate is of n-type,
    the first amorphous semiconductor layer comprises:
        a first i-type amorphous semiconductor layer formed on the light-receiving surface of the crystalline semiconductor substrate; and
        a first n-type amorphous semiconductor layer formed on the first i-type amorphous semiconductor layer, and
    the second amorphous semiconductor layer comprises:
        a second i-type amorphous semiconductor layer formed on the backside surface of the crystalline semiconductor substrate; and
        a second n-type amorphous semiconductor layer formed on the second i-type amorphous semiconductor layer
    the photoelectric conversion element further comprises:
        a first electrode portion formed in a first region located above the second n-type amorphous semiconductor layer; and
        a second electrode portion formed in a second region located above a second p-type amorphous semiconductor layer formed on the backside surface, the second region being different from the first region.

2. The method for producing a photoelectric conversion element according to claim 1, wherein
    at least one of the protective layers comprises one of aluminum oxide, aluminum nitride, silicon nitride, and silicon oxide.

3. A method for producing a photoelectric conversion element, the method comprising:
    forming a first amorphous semiconductor layer on a light-receiving surface of a crystalline semiconductor substrate;
    forming a second amorphous semiconductor layer on a backside surface of the crystalline semiconductor substrate; and
    forming, after completion of the forming the first amorphous semiconductor layer and the forming the second amorphous semiconductor layer, a protective layer on the first amorphous semiconductor layer, and subsequently forming a protective layer on the second amorphous semiconductor layer;

wherein the first amorphous semiconductor layer has a first n-type amorphous semiconductor layer formed on the light-receiving surface of the crystalline semiconductor substrate, and the second amorphous semiconductor layer has a second n-type amorphous semiconductor layer formed on the backside surface of the crystalline semiconductor substrate, and wherein the photoelectric conversion element further comprises:
- a first electrode portion formed in a first region located above the second n-type amorphous semiconductor layer; and
- a second electrode portion formed in a second region located above a p-type amorphous semiconductor layer formed on the second n-type amorphous semiconductor layer, the second region being different from the first region.

* * * * *